(12) United States Patent
Chang et al.

(10) Patent No.: US 11,156,669 B2
(45) Date of Patent: Oct. 26, 2021

(54) BATTERY TESTING DEVICE AND METHOD THEREOF

(71) Applicants: Shuo-Chieh Chang, Taoyuan (TW); Che-Wei Wu, Taoyuan (TW); Ta-Cheng Lin, Taoyuan (TW); Ming-Ying Tsou, Taoyuan (TW)

(72) Inventors: Shuo-Chieh Chang, Taoyuan (TW); Che-Wei Wu, Taoyuan (TW); Ta-Cheng Lin, Taoyuan (TW); Ming-Ying Tsou, Taoyuan (TW)

(73) Assignee: CHROMA ATE INC., Taoyuan (TW)

( * ) Notice: Subject to any disclaimer, the term of this patent is extended or adjusted under 35 U.S.C. 154(b) by 0 days.

(21) Appl. No.: 16/819,176

(22) Filed: Mar. 16, 2020

(65) Prior Publication Data

US 2020/0300921 A1 Sep. 24, 2020

(30) Foreign Application Priority Data

Mar. 18, 2019 (TW) .................................. 108109004

(51) Int. Cl.
*G01R 31/3842* (2019.01)
*G01R 31/392* (2019.01)
*G01R 31/52* (2020.01)
*G01R 31/3828* (2019.01)

(52) U.S. Cl.
CPC ..... *G01R 31/3842* (2019.01); *G01R 31/3828* (2019.01); *G01R 31/392* (2019.01); *G01R 31/52* (2020.01)

(58) Field of Classification Search
None
See application file for complete search history.

(56) References Cited

U.S. PATENT DOCUMENTS

2007/0001647 A1* 1/2007 D'Avanzo .......... G01R 31/3832
320/132
2016/0126573 A1* 5/2016 Yoon ................. H01M 8/04686
324/537

* cited by examiner

*Primary Examiner* — Jas A Sanghera

(57) ABSTRACT

Herein disclosed is a device for testing batteries as subjects and a method thereof. The battery testing device comprises a power supply module and a short-circuit sensing module. The power supply module is configured to provide a first testing voltage or a first testing current. The short-circuit sensing module, coupled with the power supply module, is configured to integrate the first testing voltage or current during a first testing period, thereby calculating a first output energy provided by the power supply module. The short-circuit sensing module also determines whether the first output energy exceeds a predetermined energy range; when the range is exceeded, the same module generates an error signal. Wherein the short-circuit sensing module generates an error count by calculating during a second testing period the number of times the short-circuit sensing module generates the error signal.

7 Claims, 8 Drawing Sheets

BATTERY TESTING DEVICE AND METHOD THEREOF

CROSS REFERENCE TO RELATED APPLICATION

The present application claims priority to Taiwan patent application Serial No. 108109004 filed on Mar. 18, 2019, the entire content of which is incorporated by reference to this application.

BACKGROUND OF THE INVENTION

1. Field of the Invention

The present invention pertains to a battery testing device and method thereof, in particular one that looks for short circuits internal to batteries.

2. Description of the Prior Art

The market for electronics never ceases to evolve. Consumers now expect new products to outperform their predecessors as well as outlasting them in terms of battery life. Incorporating more batteries, each with a higher capacity, in these products is one way to meet customer demands, but also brings to a head the challenge of testing the batteries for stability, reliability, and safety.

One can obtain a battery's electrical properties by repeatedly charging and discharging it with a typical testing device. In particular, the device analyzes the charging voltage or current to evaluate whether the battery is of normal quality. Said test, however, is beholden to efficiency requirements. When the device can only spend so much time on each subject, there are bound to be hazard factors that are overlooked but present in the charging voltage or current.

To illustrate, consider a high-capacity battery in which insulating films are employed to separate different layers or neighboring energy storage units. Any breach of an insulating film renders the neighboring layers or units a short circuit, which instantly alters the characteristics of the charging voltage or current. The alteration is ever so slight that it is hard to be accurately pinned down, but does put the subject battery's stability and lifespan in doubt. The typical testing device clearly has room for improvement.

SUMMARY OF THE INVENTION

The present invention provides a battery testing device that, by integrating the voltage or current provided by the power supply module, determines whether there is a short circuit inside a battery.

The present invention discloses a battery testing device for testing a subject battery. The battery testing device comprises a power supply module and a short-circuit sensing module. The short-circuit sensing module, coupled with the power supply module, is configured to integrate during a first testing period a first testing voltage or a first testing current provided by the power supply module, thereby calculating a first output energy provided by the power supply module. The short-circuit sensing module also determines whether the first output energy exceeds a predetermined energy range. The short-circuit sensing module generates an error signal when the first output energy exceeds the predetermined energy range.

In one embodiment, the power supply module has a constant-voltage mode and a constant-current mode. When the power supply module operates under the constant-voltage mode, the short-circuit sensing module integrates the first testing current provided by the power supply module. When the power supply module operates under the constant-current mode, the short-circuit sensing module integrates the first testing voltage provided by the power supply module. The short-circuit sensing module may include a band-pass filter, which is coupled to the power supply module and configured to selectively retrieve the first testing voltage or current within a frequency interval. The short-circuit sensing module may further include a sampling circuit that is coupled to the band-pass filter and configured to integrate during the first testing period the first testing voltage or current within said frequency interval. During a second testing period, the short-circuit sensing module may calculate the number of times it generates the error signal and thereby generate an error count.

The present invention also discloses a battery testing method for testing a subject battery. The battery testing method comprises the following steps, the first of which is providing a power supply module that is configured to provide a first testing voltage or a first testing current. During a first testing period, the first testing voltage or current is integrated so as to calculate a first output energy. It is then determined whether the first output energy exceeds a predetermined energy range. When the range is exceeded, an error signal is generated.

To summarize: By integrating the voltage or current provided by the power supply module, the battery testing device of the present invention is able to calculate the instantaneous output rate of the power supply module and therefore determine whether there is a short circuit inside the subject battery. Compared to tests of the same vein, the present invention finds internal short circuits quicker and with more precision.

BRIEF DESCRIPTION OF THE APPENDED DRAWINGS

DETAILED DESCRIPTION OF THE INVENTION

The features, objections, and functions of the present invention are further disclosed below. However, it is only a few of the possible embodiments of the present invention, and the scope of the present invention is not limited thereto; that is, the equivalent changes and modifications done in accordance with the claims of the present invention will remain the subject of the present invention. Without departing from the spirit and scope of the invention, it should be considered as further enablement of the invention.

Figure 1:
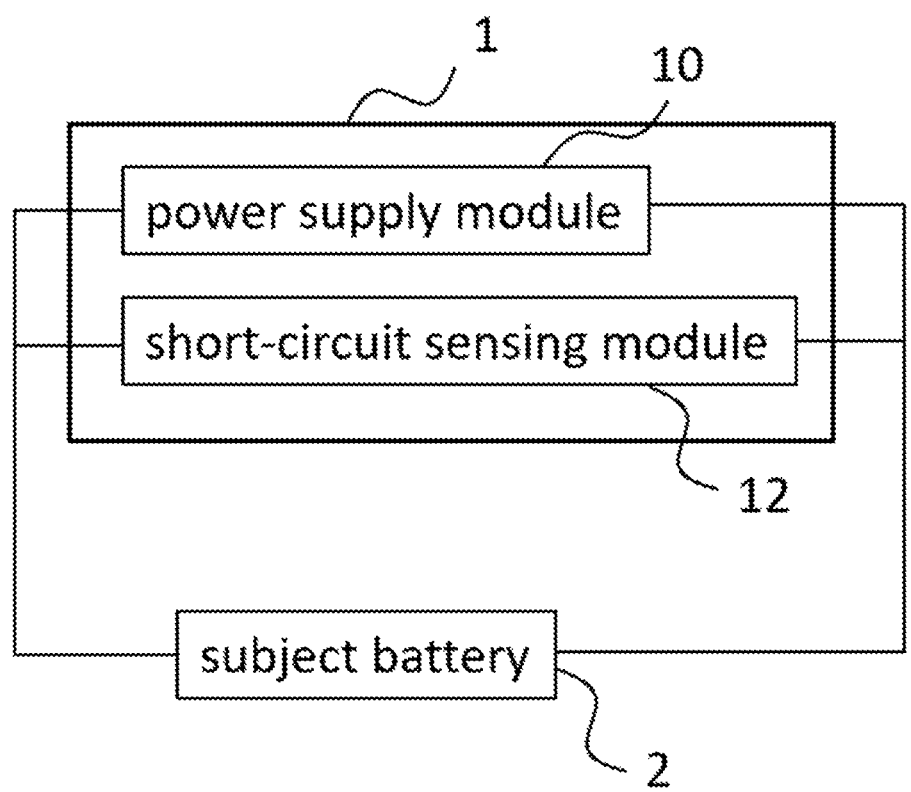
FIG. 1 is a block diagram of a battery testing device in accordance with an embodiment of the present invention.

Please refer to FIG. 1, a block diagram of a battery testing device in accordance with an embodiment of the present invention. As shown in FIG. 1, a battery testing device 1 is electrically and detachably connected to a subject battery 2 so as to perform electrical tests on the latter. The present embodiment applies regardless of the type and capacity of the subject battery 2. The subject 2 may be of lower capacity, like those for cell phones, tablet computers, or laptops; or it may be a higher-capacity battery used on an electric vehicle or a sizable machine. The subject 2 may be a lithium-based battery, or a structurally equivalent one where the anode and the cathode are also separated by one or more insulating films but made of other materials. The battery testing device 1 comprises a power supply module 10 and a short-circuit sensing module 12. The modules 10 and 12 are coupled with each other. While the battery testing device 1 is electrically connected to the subject battery 2, the power supply module 10 and the short-circuit sensing module 12 can be said the same.

The power supply module 10 is configured to provide the subject battery 2 with electric energy that is, broadly speaking, deployed in said electrical tests. In one example, the power supply module 10 is a commercial power supply and provides energy in multiple modes. For instance, the power supply module 10 may operate under a constant-voltage mode, a constant-current mode, or a user-defined mode, in order to charge the subject battery 2 with a constant voltage, a constant current, or a voltage or current of a particular pattern. Although the power supply module 10 is configured to charge the subject battery 2, the electrical tests performed on the subject 2 are not limited to those of a charging nature. The battery testing device 1 may, for instance, include another module configured to expend electric energy stored in the subject battery 2; in other words, said tests may include a discharge test.

Figure 2A:
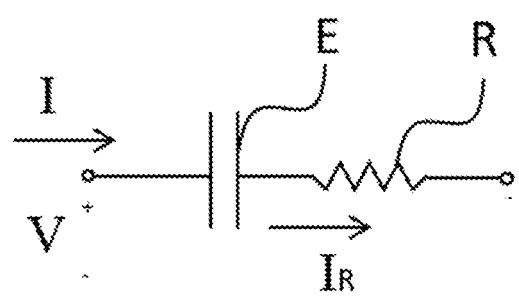
FIG. 2A is a circuit diagram of a subject battery without an internal short circuit, in accordance with an embodiment of the present invention.
Figure 2B:
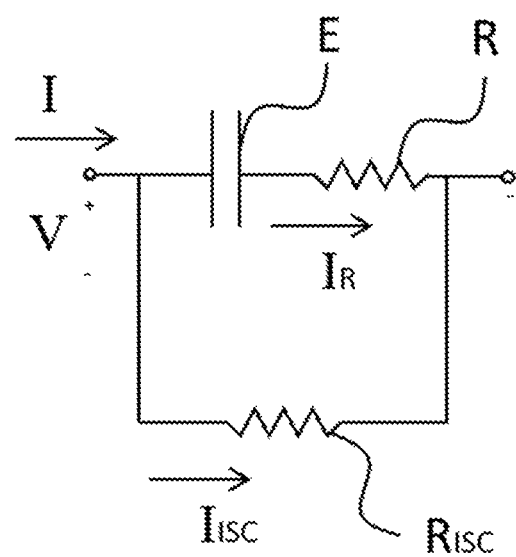
FIG. 2B is a circuit diagram of a subject battery with an internal short circuit, in accordance with an embodiment of the present invention.

According to conventional wisdom, it is not easy to detect an internal short circuit of the subject battery 2, especially if that short circuit is minor. To illustrate the impact of an internal short circuit, the subject battery 2 is modeled as equivalent circuits in the immediate description. Please refer to FIGS. 1, 2A, and 2B in conjunction. FIGS. 2A and 2B are circuit diagrams of the subject battery 2 when it is, respectively, without and with an internal short circuit, in accordance with an embodiment of the present invention. When there are no internal short circuits, the subject battery 2 can be viewed as a simple combination of an energy storage unit E and a resistor unit R, as shown in FIG. 2A. The charging current I is that provided by the power supply module 10; the current that flows through the energy storage unit E and the resistor unit R is named $I_R$. Assume that the subject battery 2 is charged under a constant-voltage mode, the power supply module 10 providing I and a charging voltage V. A person skilled in the art would observe that $I_R$ is equal to the charging current I, while both decreases as the voltage across the energy storage unit E approaches V.

The equivalent circuit of the subject battery 2 converts to FIG. 2B when a short circuit appears therein at some point in time. In FIG. 2B, the combination of the energy storage unit E and the resistor unit R is connected in parallel with an internal-short-circuit resistor unit $R_{ISC}$. The current that flows through $R_{ISC}$ is named $I_{ISC}$. According to Kirchhoff's current law, the charging current I is the sum of $I_R$ and $I_{ISC}$; in other words, part of the charging current I provided by the power supply module 10 is shunted due to the sudden appearance of an internal short circuit, giving rise to $I_{ISC}$ and reducing $I_R$ instantly. The power supply module 10, under the constant-voltage mode, duly raises the charging current I to maintain the combined voltage across the units E and R, a reaction a person skilled in the art would find necessary.

In the present embodiment, we may distinguish existent yet less serious "micro internal short circuits" from disastrous cases of internal short circuits. A "micro" case may be a fleeting occurrence of a short circuit, such as when a breach is found of an insulating film but promptly carbonized and closed; or it may be that the equivalent resistance $R_{ISC}$ is significantly greater than R, such as when an insulating film is thinned almost to the point of breach and thus not entirely insulating.

Consider the case where $R_{ISC}$ is significantly greater than R. $I_{ISC}$, the current that flows through the internal-short-circuit resistor unit $R_{ISC}$, is significantly smaller than $I_R$, which flows through the resistor unit R. As $I_{ISC}$ is negligible compared to $I_R$, $I_R$ is almost equal to the charging current I itself. In other words, the fluctuation in time of I, the output of the power supply module 10, may be so subtle that it is instead misidentified as common interference or noise. It is therefore nigh impossible to detect a micro internal short circuit based on the fluctuation of the charging current I. The present embodiment does not dictate the ratio of $R_{ISC}$ to R; $R_{ISC}$ may be 10, 50, 100, or even 100 times R.

Figure 3:
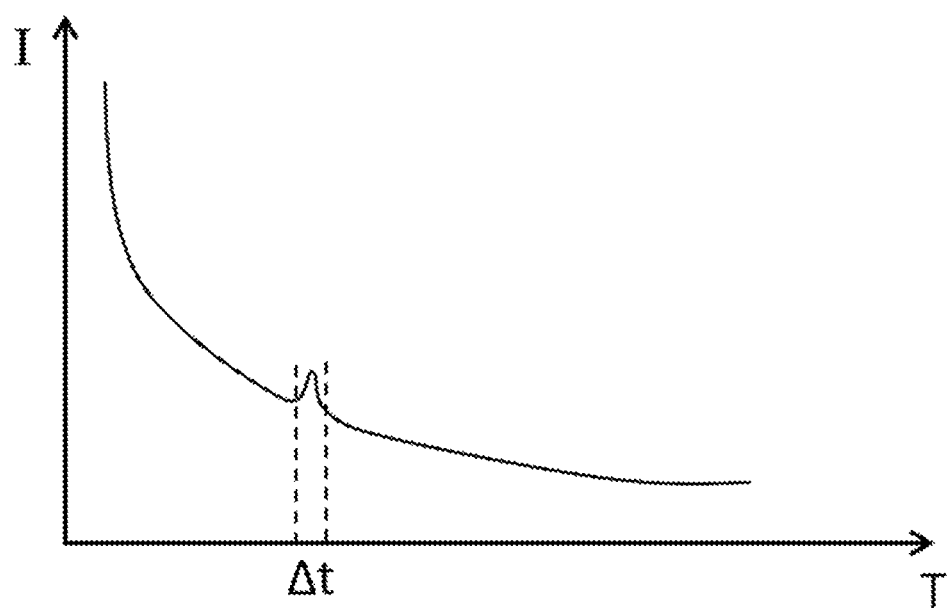
FIG. 3 is an oscillogram of a charging current, in accordance with an embodiment of the present invention.
Figure 4:
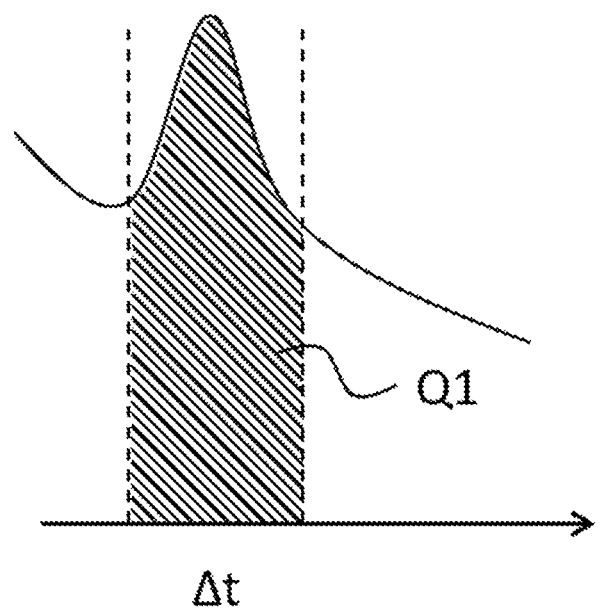
FIG. 4 depicts an integration of the charging current, in accordance with FIG. 3.

The short-circuit sensing module 12, coupled with the power supply module 10, exists to facilitate the detection of micro internal short circuits. Assuming still that the subject battery 2 is charged under a constant-voltage mode, please refer to FIGS. 1, 2B, 3, and 4 in conjunction. In accordance with an embodiment of the present invention, FIG. 3 is an oscillogram of the charging current I, and FIG. 4 depicts an integration of I. As depicted in FIG. 3, a micro internal short circuit occurs during a time period Δt and alters the charging current I. The fluctuation of I during Δt has been exaggerated in FIG. 3 for the convenience of a reader skilled in the art; the alteration made by a micro internal short circuit to a charging current is usually too small to show up in an oscillogram. In any case, the short-circuit sensing module 12 integrates during the time period Δt (first testing period) the charging current I (first testing current) provided by the power supply module 10, thereby calculating an energy value Q1 (first output energy) provided by the power supply module 10.

Here is where the present invention and prior art differ. Prior art often misses its target for it is based solely on the charging current's fluctuation, which is subject to interference by noise. The circuitry of the sensing module 12, on the other hand, applies integration directly on the charging current I over Δt to obtain the relevant bounded area, which, as a person skilled in the art would recall, is the total quantity of electricity provided by the power supply module 10 during Δt. The total quantity of electricity is related to the energy value Q1. The module 12 is more sensitive to micro internal short circuits because of the use of integration.

In addition, the short-circuit sensing module 12 determines whether Q1 exceeds a predetermined energy range. When Q1 exceeds the predetermined energy range, the short-circuit sensing module 12 generates an error signal. Consider the case where there are no micro internal short circuits. The energy value that the sensing module 12 calculates after integrating I over Δt should fall within the predetermined range, even if the charging current I somewhat wavers due to interference by noise. In other words, the short-circuit sensing module 12 determining that Q1 does not exceed the predetermined energy range is the same as the module 12 not finding any micro internal short circuit in the subject battery 2 during the time period Δt, hence no error signal generated. Conversely, if the short-circuit sensing module 12 determines that Q1 has exceeded the predetermined energy range, the module 12 deems that during Δt an micro internal short circuit appeared in the subject battery 2 and generates the error signal.

In practice, the electrical tests the battery testing device 1 performs on the subject battery 2 usually last for a sustained period of time (second testing period). The tests may be minutes or hours of continuous charging, for instance. During the second testing period, the short-circuit sensing module 12 integrates the charging current I respectively over every first testing period (that may be as long as Δt). If micro internal short circuits occur in several first testing periods, the module 12 is expected to generate the error signal a number of times. The battery testing device 1 may generate an error count by calculating the number of times the short-circuit sensing module 12 generates the error signal during the electrical tests. The error count may then serve as an indication of the quality or health of the subject battery 2. When the error count manages to stay below a first threshold during the tests, the testing device 1 may, for example, mark the subject battery 2 as fit for shipping. Conversely, the testing device 1 may mark the subject battery 2 as defective when its error count exceeds a second threshold during the tests.

In another example, the error count may serve as a sign for the battery testing device 1 to abort. Suppose the second threshold is exceeded during the tests. In addition to marking the subject batter 2 as defective, the battery testing device 1 may also determine that the subject 2 is no longer fit to be charged due to repeated occurrences of micro internal short circuits. Insisting on carry out the charge test may cause the subject battery 2 to overheat and may even jeopardize the testing device 1 itself, resulting in more damage. Of course, the fact that the error count has exceeded the second threshold and that the subject battery 2 is marked as defective is enough reason to abort the tests. Please note that the exact values of the first and second thresholds are for a person skilled in the art a matter of design choice on which the present embodiment poses no restriction.

Also note that a user of the battery testing device 1 has the freedom to specify the predetermined energy range. The range may be set in reference to background noise or how tolerant the subject battery 2 is toward micro internal short circuits. Recall that the energy value Q1 is associated with the fluctuation of the charging current I and the time period Δt. The smaller the internal-short-circuit resistance, $R_{ISC}$, is, the more fluctuation there is in I. How long the micro internal short circuits last is also positively correlated to the length of Δt. There are therefore a number of factors that the user may take into account when predetermining the energy range. One such factor is the least $R_{ISC}$ registered with regard to an occurrence of a micro short circuit in the subject battery 2. Another is the longest time sustained by a micro internal short circuit. The present embodiment does not prescribe the upper and lower bounds of the predetermined energy range, which may be adjusted to accommodate different subject batteries.

Figure 5:
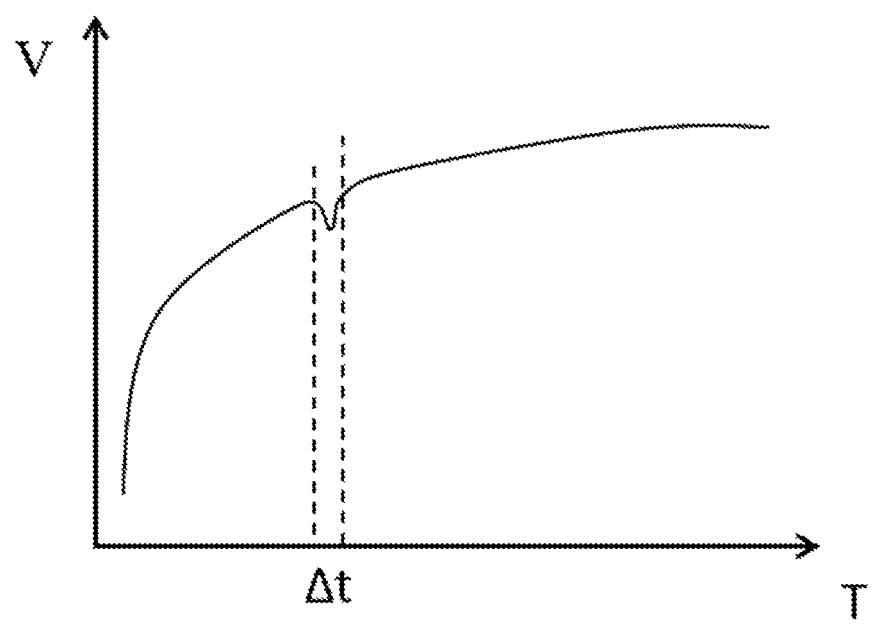
FIG. 5 is an oscillogram of a charging voltage, in accordance with an embodiment of the present invention.

Recall that the power supply module 10 may operate under a variety of modes. The short-circuit sensing module 12, therefore, does not have to integrate the charging current I during Δt. Instead, the short-circuit sensing module 12 may calculate an energy value by integrating the charging voltage V (after adequate conversion) over Δt. Assuming that the subject battery 2 is charged under a constant-current mode, please refer to FIGS. 1, 2B, and 5. In accordance with an embodiment of the present invention, FIG. 5 is an oscillogram of the charging voltage V. As depicted in FIG. 5, a micro internal short circuit occurs during a time period Δt and alters the charging voltage V. The fluctuation of V during Δt has been exaggerated in FIG. 5 and reflects the fact that $I_R$, the current flowing through the energy storage unit E and the resistor unit R, is diminished, considering that the internal-short-circuit resistance $R_{ISC}$ is unknown for the time being. To stabilize $I_R$, the power supply module 10 has to provide more of the charging current I, a reaction with which a person skilled in the art would sympathize.

By means of the circuitry of the short-circuit sensing module 12, it is practicable to convert the fluctuation of V into the extra I required of the power supply module 12, the conversion being in the form of a function denoted $f(v)$. Integrating said function over the time period Δt, one obtains the total quantity of electricity provided by the power supply module 10 during Δt. That quantity is related to an energy value Q2, which is not shown in the figures. As the charging current I is a function of the charging voltage V, the integration of I over Δt can be achieved by substituting I with $f(v)$. In other words, calculating the energy value Q2 by integrating V during the time period Δt is a legitimate proposition. To round up its operation, the short-circuit sensing module 12 determines whether a predetermined energy range is exceeded by Q2. When Q2 exceeds the predetermined energy range, the sensing module 12 generates an error signal. The takeaway is that the sensing module 12 is able to detect micro internal short circuits of the subject battery 2 and thus uncover its defects, if any, with precision, by referencing the charging voltage V or current I from the power supply module 10, no matter under which mode the module 10 operates.

Figure 6:
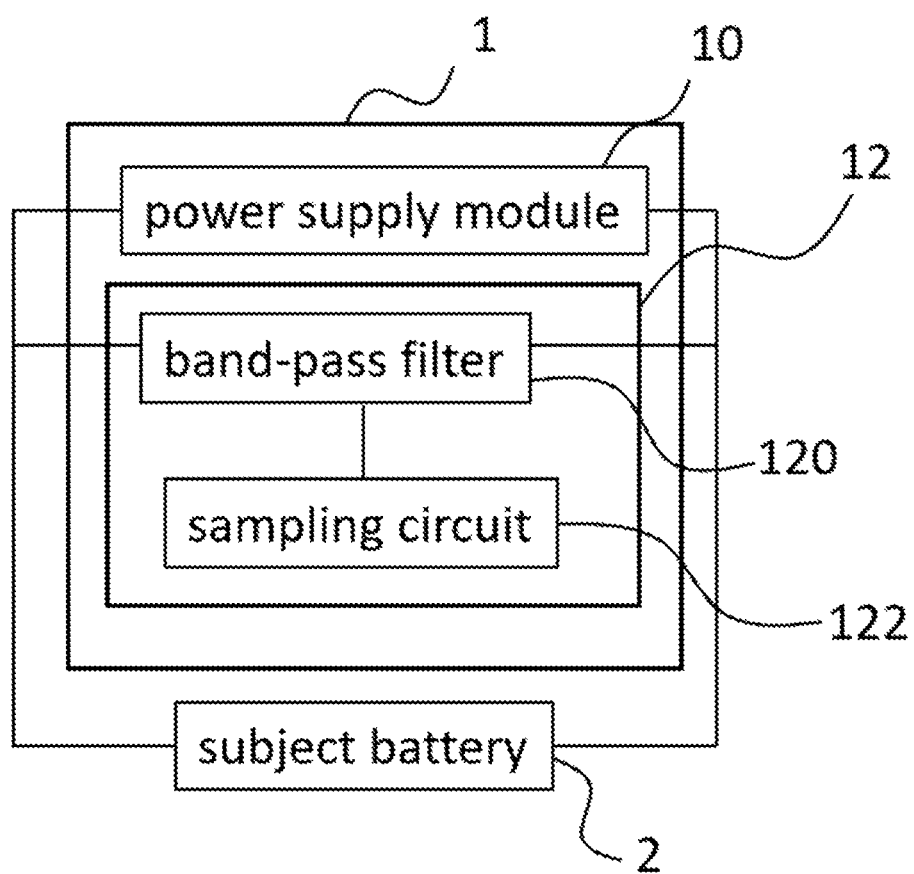
FIG. 6 is a block diagram of a battery testing device in accordance with another embodiment of the present invention.
Figure 7:
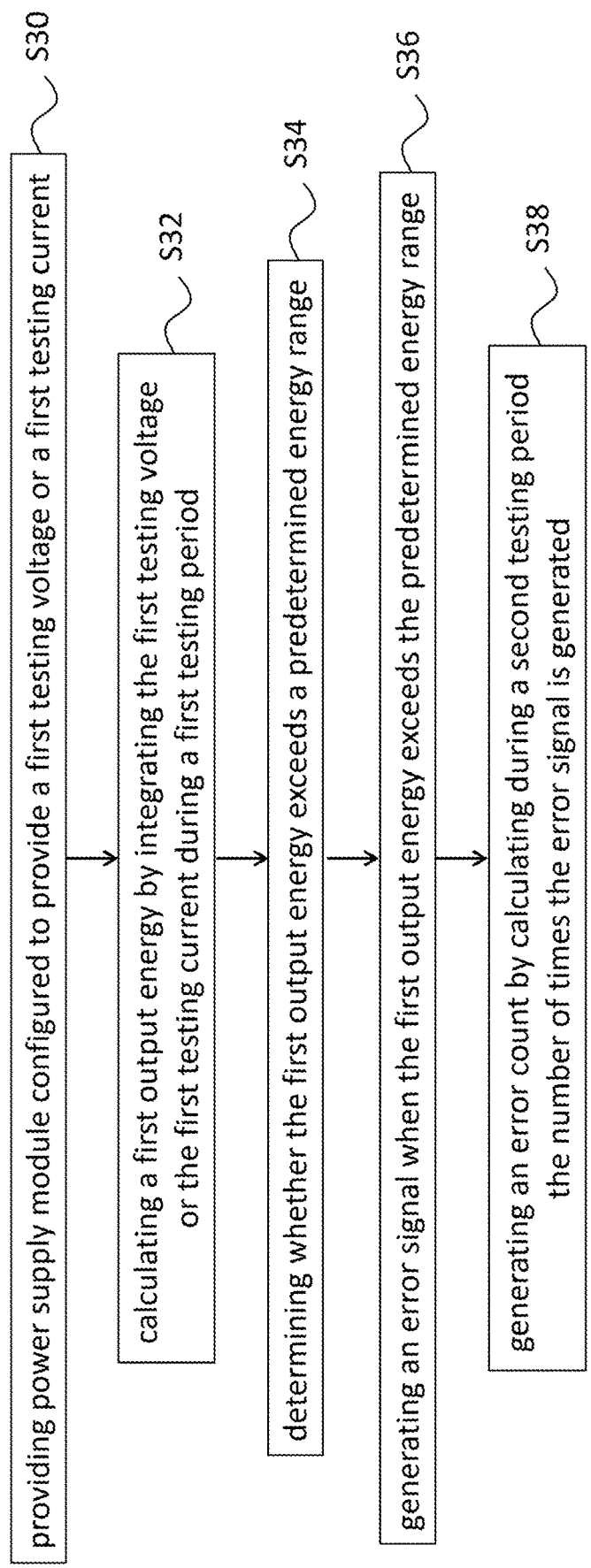
FIG. 7 is a flow chart of a battery testing method in accordance with an embodiment of the present invention.

The short-circuit sensing module 12 is, in essence, configured to detect the fluctuation of the charging voltage V or current I. It is thus desirable that the module 12 further incorporates a band-pass filter and a sampling circuit in its implementation to reduce the interference by noise. Please refer to FIGS. 1 and 6 in conjunction. FIG. 6 is a block diagram of a battery testing device in accordance with another embodiment of the present invention. As FIG. 6 demonstrates, the short-circuit sensing module 12 may comprise a band-pass filter 120 and a sampling circuit 122. The band-pass filter 120 is coupled to the power supply module 10, and the sampling circuit 122 to the band-pass filter 120. By definition, the band-pass filter 120 filters out signals outside of an associated frequency interval. The frequency interval may be set between 50 Hz and 500 Hz, for in practice the fluctuation of the charging voltage V or current I from the power supply module 10 falls roughly in that range. In other words, the band-pass filter 120 discards low-frequency noise below 50 Hz and high-frequency noise above 500 Hz, in a bid to reduce the amount of signals it has to process.

In one example, the band-pass filter 120 retrieves the fluctuation of the charging voltage V or current I within the frequency interval, and feeds that filtered V or I into the sampling circuit 122. During the time period Δt, the sampling circuit 122 integrates the filtered V or I, thereby calculating the energy value provided by the power supply module 10. The sampling circuit 122 may be of the peak-hold sort, configured to record the maximum fluctuation of the filtered V or I during Δt and thus produce the integrated energy value. Of course, there are other types of integration circuits that a person skilled in the art may source as the sampling circuit 122.

For a rundown of the battery testing method of the present invention, please refer to FIGS. 1, 2A, 2B, and 7 in conjunction. In accordance with an embodiment of the present invention, the method is for testing the subject battery 2 and comprises the following steps as visualized in the FIG. 7. The power supply module 10, provided in step S30, is configured to provide a first testing voltage or a first testing current, in particular the charging voltage V or current I. The charging current I equals $I_R$, the current flowing through the energy storage unit E and the resistor unit R. Assume that the subject battery 2 is charged under a constant-voltage mode, then in step S32 the short-circuit sensing module 12 calculates the energy value Q1 (first output energy) provided by the power supply module 10 by integrating during the time period Δt (first testing period) the charging current I (first testing current) provided by the power supply module 10. The short-circuit sensing module 12 further determines in step S34 whether Q1 exceeds a predetermined energy range. When Q1 exceeds the predetermined energy range, the short-circuit sensing module 12 generates the error signal in step S36. In step S38, the short-circuit sensing module 12 generates an error count by calculating during a second testing period the number of times the short-circuit sensing module 12 generates the error signal. Please note that the steps have already been expounded upon in the previous embodiments and will not be repeated here.

To summarize: The battery testing device of the present invention has a short-circuit sensing module which calculates an energy value by integrating said charging voltage or current, determines whether the energy value exceeds a predetermined energy range, and thereby with adroitness finds anomalies like short circuits internal to the subject battery.

What is claimed is:

1. A battery testing device for testing a subject battery, the battery testing device comprising:
    a power supply module; and
    a short-circuit sensing module coupled with the power supply module and configured to calculate, by integrating during a first testing period a first testing voltage or a first testing current provided by the power supply module, a first output energy provided by the power supply module;
    wherein the short-circuit sensing module determines whether the first output energy exceeds a predetermined energy range;
    wherein the short-circuit sensing module generates an error signal when the first output energy exceeds the predetermined energy range;
    wherein the short-circuit sensing module generates an error count by calculating during a second testing period the number of times the short-circuit sensing module generates the error signal.

2. The battery testing device according to claim 1, wherein:
    the power supply module has a constant-voltage mode and a constant-current mode;
    the short-circuit sensing module integrates the first testing current provided by the power supply module when the power supply module operates under the constant-voltage mode; and
    the short-circuit sensing module integrates the first testing voltage provided by the power supply module when the power supply module operates under the constant-current mode.

3. The battery testing device according to claim 2, wherein the short-circuit sensing module has a band-pass filter coupled to the power supply module, and wherein the band-pass filter is configured to selectively retrieve the first testing voltage or the first testing current within a frequency interval.

4. The battery testing device according to claim 3, wherein the short-circuit sensing module has further a sampling circuit coupled to the band-pass filter, and wherein the sampling circuit is configured to integrate during the first testing period the first testing voltage or the first testing current within the frequency interval.

5. A battery testing method for testing a subject battery, the battery testing method comprising:
    providing a power supply module configured to provide a first testing voltage or a first testing current;
    calculating a first output energy by integrating the first testing voltage or the first testing current during a first testing period;
    determining whether the first output energy exceeds a predetermined energy range;
    generating an error signal when the first output energy exceeds the predetermined energy range; and
    generating an error count by calculating during a second testing period the number of times the error signal is generated.

6. The battery testing method according to claim 5, wherein:
    the power supply module has a constant-voltage mode and a constant-current mode;
    the first testing current provided by the power supply module is integrated when the power supply module operates under the constant-voltage mode; and
    the first testing voltage provided by the power supply module is integrated when the power supply module operates under the constant-current mode.

7. The battery testing method according to claim 6, wherein during the step of calculating the first output energy by integrating the first testing voltage or the first testing current during the first testing period, the first testing voltage or the first testing current is selectively integrated within a frequency interval.

* * * * *